(12) United States Patent
Gibbons, II et al.

(10) Patent No.: US 6,741,189 B1
(45) Date of Patent: May 25, 2004

(54) KEYPAD HAVING OPTICAL WAVEGUIDES

(75) Inventors: R. Thomas Gibbons, II, Seattle, WA (US); John M. Lutian, Bellevue, WA (US); Kennard E. Nielsen, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/413,389

(22) Filed: Oct. 6, 1999

(51) Int. Cl.$^7$ .................. H03M 11/00; H03K 17/94

(52) U.S. Cl. ............... 341/31; 359/88; 250/227.22; 385/123

(58) Field of Search .............. 341/31; 359/188; 250/227.22, 227.11, 215, 216; 385/123, 128

(56) References Cited

U.S. PATENT DOCUMENTS

| | | | |
|---|---|---|---|
| 3,648,050 A | 3/1972 | Koo | 250/208 |
| 3,886,544 A | 5/1975 | Narodny | 340/365 P |
| 3,937,952 A | 2/1976 | Ripley et al. | 250/227 |
| 4,480,182 A | 10/1984 | Ely et al. | 250/227 |
| 4,480,184 A | 10/1984 | Ely | 250/227 |
| 4,641,026 A | 2/1987 | Garcia, Jr. | 250/229 |
| 4,733,068 A | 3/1988 | Thiele et al. | 250/227 |
| 4,878,722 A | 11/1989 | Nelson et al. | 350/96.2 |
| 4,884,073 A | 11/1989 | Souloumiac | 341/31 |
| 4,900,920 A | 2/1990 | Federmann et al. | 250/227 |
| 4,931,794 A | 6/1990 | Haag et al. | 341/31 |
| 4,980,685 A | 12/1990 | Souloumiac et al. | 341/31 |
| 5,384,459 A | 1/1995 | Patino et al. | 250/229 |
| 5,399,854 A | 3/1995 | Dunphy et al. | 250/227.17 |
| 5,477,223 A | 12/1995 | Destremps | 341/31 |
| 5,677,688 A | 10/1997 | O'Mara et al. | 341/31 |
| 6,058,226 A | * 5/2000 | Starodubov | 385/12 |

FOREIGN PATENT DOCUMENTS

| | | |
|---|---|---|
| EP | 0 143 583 A2 | 6/1985 |
| EP | 0 379 253 | 7/1990 |
| FR | 2 536 185 | 5/1984 |
| JP | 10083185 | 3/1998 |
| WO | WO 86/01954 | 3/1986 |

OTHER PUBLICATIONS

"Nonlinear Bent Single–Mode Waveguide as a Simple All–Optical Wwitch" by Robert W. Micallef et al. for *Optics Communications*, vol. 147, Nos. 4, 5, 6, Feb. 15, 1998 No page nos.

"Mechanically Driven Micromechanical Optical Switch" by Dai Kobayashi et al., for Pacific Rim Conference on Lasers and Electro–Optics, CLEO–Technical Digest 1997, IEEE Piscataway, NJ, pp. 267, 1997.

"Design of a 4=4 Optical Re–routing Switch" by Jens Pedersen, et al. for *DOPS–NYT (Denmark)*, vol. 12, No. 2, pp. 30–32, 1997.

"Integration of Non–linear Optical Polymer Waveguides with InGaAs p–i–n Photodiodes" by Jeffrey Cites et al., for *Applied Physics Letters* vol. 68. No. 11, pp. 1452–1454, Mar. 1996.

"Embossable Grating Couplers for Planar Waveguide Optical Sensors" by Brigitte L. Ramos et al., for *Analytical Chemistry*, vol. 68 No. 7, pp. 1245–1249, Apr. 1, 1996.

(List continued on next page.)

*Primary Examiner*—Timothy Edwards
(74) *Attorney, Agent, or Firm*—Westman, Champlin & Kelly, P.A.; S. Koehler

(57) ABSTRACT

A keypad includes a light emitting source, a light detector and waveguide assembly adapted to receive light from the light emitting source and having a plurality of waveguide branches adapted to conduct light to the light detector. A plurality of user actuated keys is provided. Each key includes a moveable engaging member disposed proximate a waveguide branch to engage the waveguide branch as a function of key operation.

43 Claims, 7 Drawing Sheets

OTHER PUBLICATIONS

"Grating Couplers in Planar Polymer Waveguides with Beam Shaping Properties" by R. Waldhausl et al. for *SPIE* vol. 2213, pp. 122–132, 1994.

"Output Intensity Control of Polymeric Planar Lightwave Circuits by Bending" by R. Yoshimura et al. for The European Institute for Communications and Networks, Geneva, pp. 111–114, Jun. 1993.

"Photoinduced Lightguides Coupled to a Dyed PMMA Matrix" by J.R. Kulisch et al., for *SPIE*, vol. 1213, pp. 112–119, 1990.

"Bragg–effect grating couplers integrated in multicomponent polymeric waveguides" by W. Driemeier, for *Optical Society of America*, Issue 15, pp. 725–727, 1990.

* cited by examiner

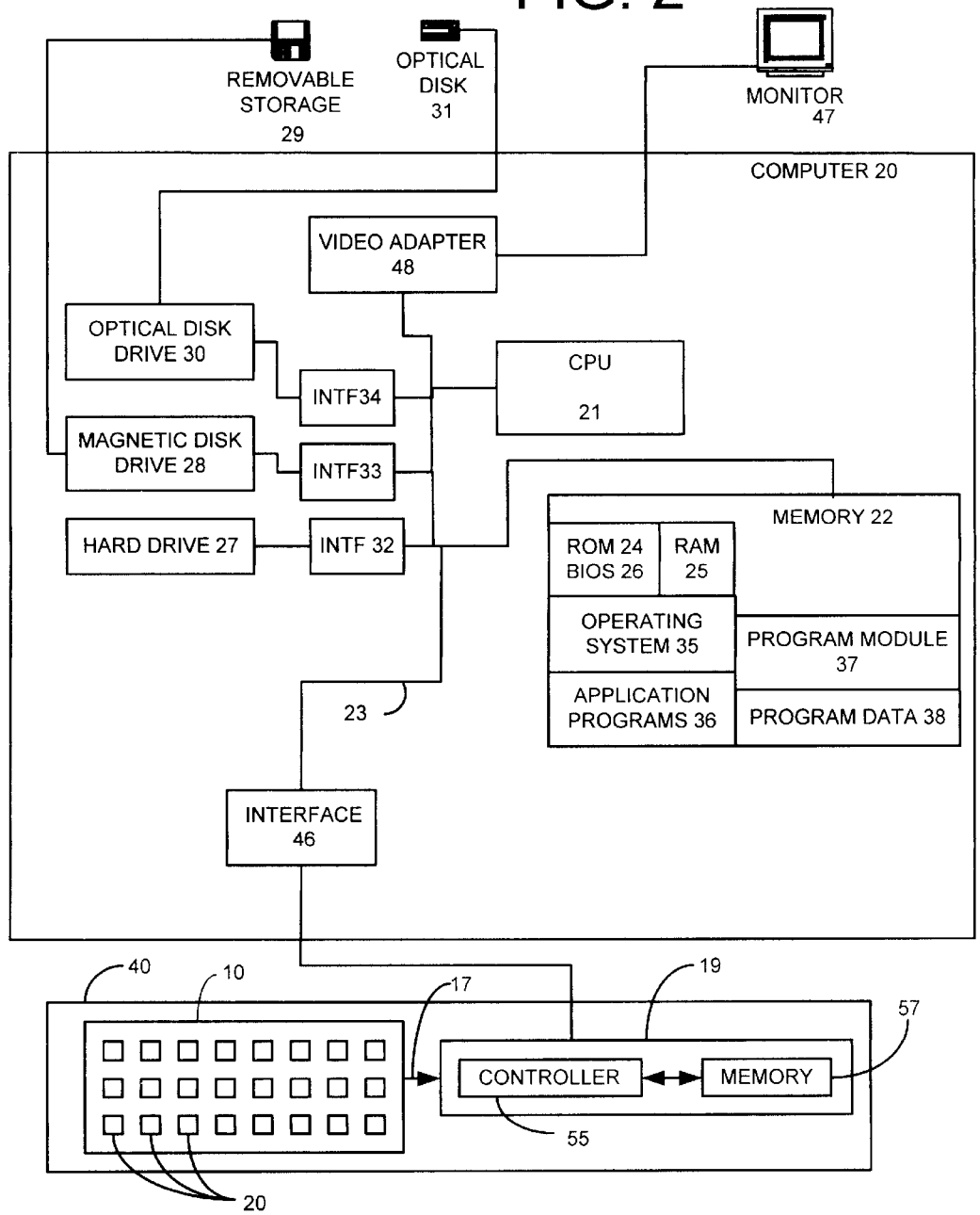

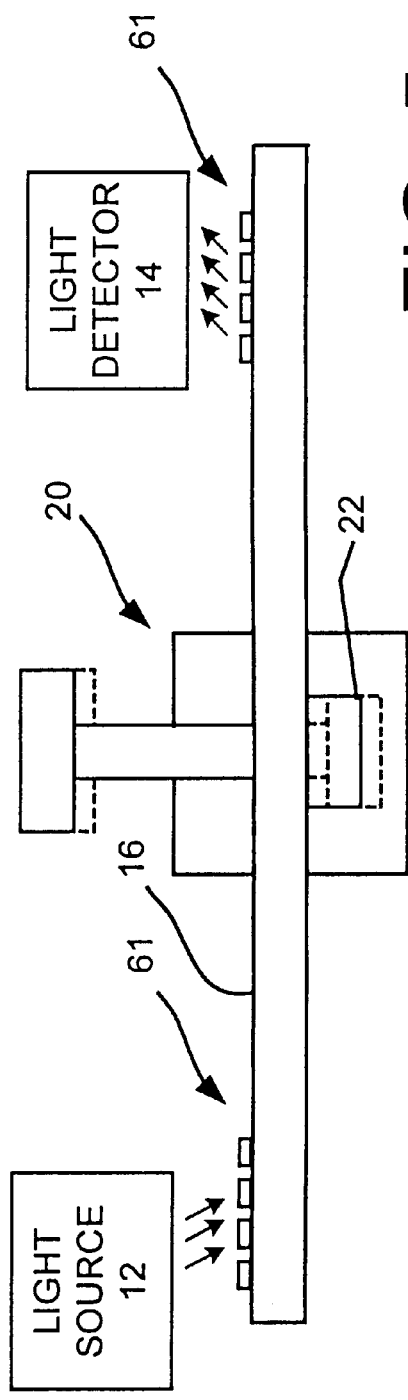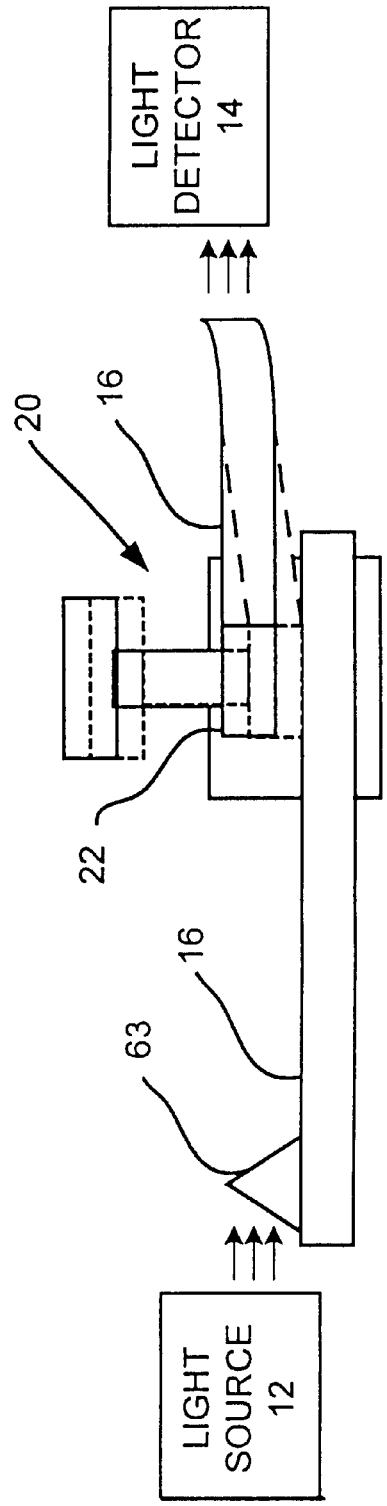

KEYPAD HAVING OPTICAL WAVEGUIDES

BACKGROUND OF THE INVENTION

The present invention generally relates to appliances having a plurality of user actuated keys. More particularly, the present invention relates to a keypad for such devices.

Multiple key keypads are used to control many types of appliances. For instance, keypads are commonly found on microwaves, telephones, remote controls and computer input devices, such as keyboards, mice and other gaming devices, to name a few. Current keypad technology generally utilizes electrical signals to detect keystrokes. For example, many keypads have conductive membranes to detect key actuation. The membrane includes conductive traces or circuits, which must remain electrically isolated from one another in order to operate correctly. The requirement of electrical isolation complicates the keypad design particularly when many keys are present.

In addition, current keypad or keyboard technology limits detection of simultaneously actuated keys. For example, almost all computer keyboards detect actuation of the "shift" key and any other alphanumeric key in order to provide capital letters or other special characters. Likewise, computer keyboards also detect simultaneous actuation of the "control" or "alt" keys in combination with other keys. However, keyboards generally do not detect simultaneous actuation of any combination of keys. This is due in part to electric circuit density limitations and the necessity for electrical isolation between adjacent circuits in a planar structure. Nevertheless, detection of other key combinations can be advantageous, for instance, in developing character based icons with a keyboard, as found, for example, with Japanese language icons.

Apart from the increased functionality of detecting other combinations of simultaneously actuated keys, there is a separate desire to reduce costs and complexity of current keypads and keyboards. An improved keypad or keyboard that addresses one, some or all these concerns is therefore desired.

SUMMARY OF THE INVENTION

A first broad aspect includes a keypad having a light emitting source, a light detector and waveguide assembly adapted to receive light from the light emitting source and having a plurality of waveguide branches is adapted to conduct light to the light detector. A plurality of user actuated keys is provided. Each key includes a moveable engaging member disposed proximate a waveguide branch to engage the waveguide branch as a function of key operation.

A second broad aspect is a method of forming a waveguide assembly having a plurality of waveguide branches. The method includes providing a waveguide medium capable of conducting light; and inducing stress in the waveguide medium to define light conducting waveguide branches.

BRIEF DESCRIPTION OF THE DRAWINGS

FIG. 2 is an exemplary environment for the keypad.

FIG. 5 is a schematic representation of a third mode of operation of the keypad.

FIG. 6 is a schematic representation of a fourth mode of operation of the keypad.

DETAILED DESCRIPTION OF THE ILLUSTRATIVE EMBODIMENTS

Figure 1:
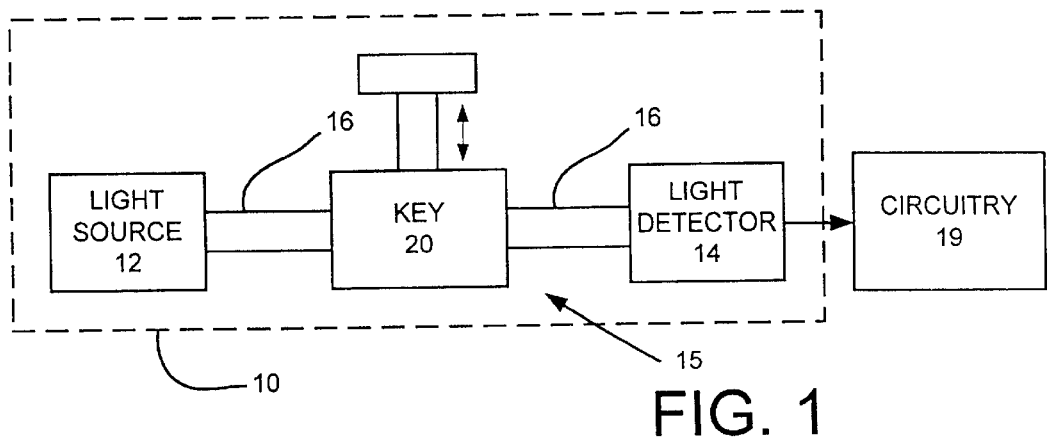
FIG. 1 is a block diagram of a keypad of the present invention coupled to a processing circuitry.

FIG. 1 illustrates in a block diagram form a keypad 10. Generally, keypad 10 includes a light emitting source 12, a light detector 14 and a waveguide assembly 15. The waveguide assembly 15 is adapted to receive light from the light emitting source 12 and includes a waveguide branch or branches 16 adapted to conduct light to the light detector 14. A plurality of user actuated keys 20 (one of which is shown) independently alter or change the light conducted in the waveguide branches 16 as a function of key actuation. Each key includes a movable engaging member 22 illustrated in the various embodiments of FIGS. 3–6. The movable engaging member 22 is disposed at least proximate, if not in contact with, the waveguide branch 16 to engage the waveguide branch 16. Light received by light detector 14 is interpreted as being a function of actuation of one or more keys. Light detector 14 provides an output signal 17 indicative of light received, and thus, key actuation to circuitry 19 of an appliance.

FIG. 2 and the related discussion are intended to provide a brief, general description of one appliance in which the invention may be used with. In this embodiment, a personal computer 20 is illustrated. It should be noted that keypad 10 can be incorporated in other appliances or devices besides that illustrated in FIG. 2. For instance, the keypad 10 can be used in other computer systems including hand-held devices and mainframes, in addition to industrial machine controllers, and consumer electronics such as telephones and remote control devices (such as for televisions, video cassette recorders, settop boxes, or digital video disc players) microwaves and facsimile machines, to name a few.

The personal computer 20 includes a processing unit 21, a system memory 18, and a system bus 23 that couples various system components including the system memory 18 to the processing unit 21. The system bus 23 may be any of several types of bus structures including a memory bus or memory controller, a peripheral bus, and a local bus using any of a variety of bus architectures. The system memory 18 includes read only memory (ROM) 24 and random access memory (RAM) 25. A basic input/output system 26 (BIOS), containing the basic routine that helps to transfer information between elements within the personal computer 20, such as during start-up, is stored in ROM 24.

The personal computer 20 further includes a hard disk drive 27 for reading from and writing to a hard disk (not shown), a magnetic disk drive 28 for reading from or writing to removable magnetic disk 29, and an optical disk drive 30 for reading from or writing to a removable optical disk 31 such as a CD ROM or other optical media. The hard disk drive 27, magnetic disk drive 28, and optical disk drive 30 are connected to the system bus 23 by a hard disk drive interface 32, magnetic disk drive interface 33, and an optical drive interface 34, respectively. The drives and the associated computer-readable media provide nonvolatile storage of computer readable instructions, data structures, program modules and other data for the personal computer 20.

Although the exemplary environment described herein employs a hard disk, a removable magnetic disk 29 and a removable optical disk 31, it should be appreciated by those skilled in the art that other types of computer readable media which can store data that is accessible by a computer, such as magnetic cassettes, flash memory cards, digital video disks, Bernoulli cartridges, random access memories (RAMs), read only memory (ROM), and the like, may also be used in the exemplary operating environment.

A number of program modules may be stored on the hard disk, magnetic disk 29, optical disk 31, ROM 24 or RAM 25, including an operating system 35, one or more application programs 36, other program modules 37, and program data 38.

A user may enter commands and information into the personal computer 20 through input devices having keypad 10, such as a keyboard 40, although the keypad 10 can be incorporated in other computer input devices such as a pointing device (mouse), gaming device or the like. These and other input devices are often connected to the processing unit 21 through an interface 46 that is coupled to the system bus 23, but may be connected by other interfaces, such as a sound card, a parallel port, a game port or a universal serial bus (USB). A monitor 47 or other type of display device can also be connected to the system bus 23 via an interface, such as a video adapter 48. In addition to the monitor 47, personal computers may typically include other peripheral output devices such as a speaker and printers (not shown).

Generally, the computer input device 40 includes the keypad 10 and circuitry 19. Keypad 10 provides the output signal 17 indicative of one or more keys 20 being actuated. Circuitry 19 is operably coupled to the keypad 10 to receive and process the output signal 17 into information for transmission to computer 20.

In one embodiment, the circuitry 19 includes a processor or controller 55 that is operably coupled to the keypad 10 to receive the output signal 17. The processor 55 is further coupled to a computer readable medium 57, such as EPROM, RAM or ROM (hereinafter "memory"). Memory 57 stores instructions which, when executed by the controller 55, processes the output signal 17 to provide information as a function of key actuation.

It should be also noted that in an alternative embodiment, the output signal 17 can be directly provided to the computer 20. In other words, the circuitry 19 can include the processor 21. The processor 21 can execute instructions stored on computer readable medium in any of the storage devices illustrated in FIG. 2 to process the output signal 17. In yet a further embodiment, the circuitry 19 can be analog circuitry that receives and processes the output signal 17. For instance, the analog circuitry can include operational amplifiers forming comparative circuits to compare the output signal 17 to preselected values in order to determine if keys 20 have been actuated.

Figure 3:
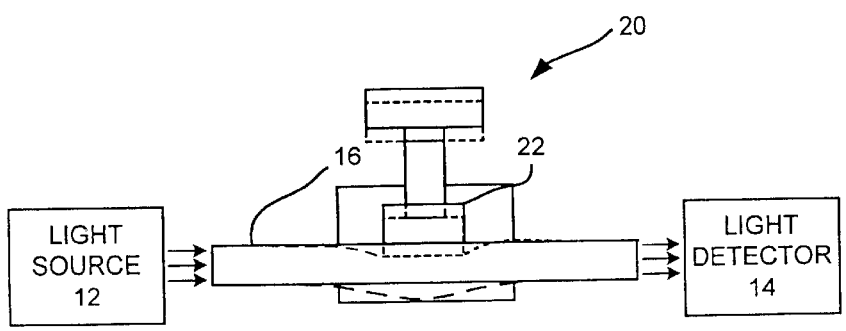
FIG. 3 is a schematic representation of a first mode of operation of the keypad.
Figure 4:
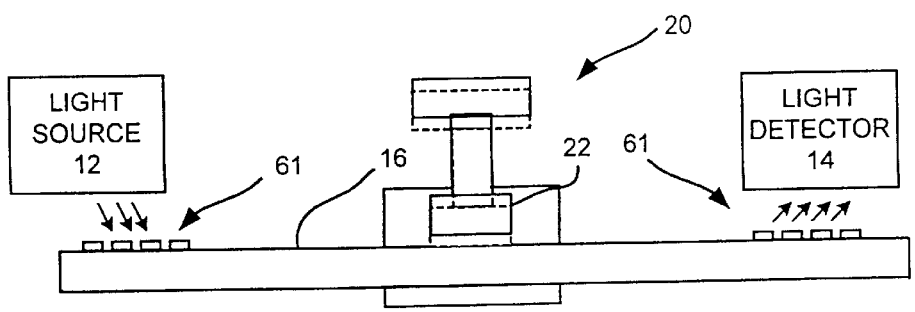
FIG. 4 is a schematic representation of a second mode of operation of the keypad.

Referring back to FIG. 1, generally a method of operation of the keypad 10 includes coupling light into the waveguide branch 16, altering a characteristic of the liqht in the waveguide branch 16 as a function of key operation and detecting key operation as a function of light received by the light detector 14. The light emitting source 12 can be coupled into the waveguide branch 16 using any of a number of known methods currently in use in the field of guided wave optics. As illustrated in FIG. 3, light can be coupled into the waveguide branch 16 using typical end-fire techniques. In another embodiment as illustrated in FIG. 4, a diffraction grating structure 61 can be provided on the waveguide branch 16 wherein light from the light emitting source 12 is diffracted into the waveguide branch 16. In yet another embodiment as illustrated in FIG. 5, a prism structure 63 can be provided on the waveguide branch 16.

The waveguide assembly 15 can be formed from any suitable light conductive medium or composition such as glass or polymers. The diffraction grating structure 61 or the prism structure 63 can be made integral with the waveguide branches 16 using injection molded techniques. In another embodiment, photo-imageable polymers in sheet form are used wherein each of the diffraction grating structures 61 and the waveguide prism structure 63 are formed therein. Both single-mode and multi-mode waveguides can be defined to support light transmission in the visible and non-visible (for example, infrared region or ultraviolet) spectrum. The thickness of the waveguide branches 16 can be controlled from a range of a few microns to a few millimeters, depending generally upon the method of waveguide forming technique chosen. For instance, when sheets of photo-imageable polymers are used, the thickness of the waveguide branch 16 can be in the approximate range of tens of microns to hundreds of microns, whereas use of injection molding techniques can realize a waveguide branch thickness of approximately one to four millimeters.

The light emitting source 12 can take a number of forms that include light emitting diodes, solid state lasers, as well as other sources emitting "white" light.

Likewise, a wide variety of detectors can be used to detect light conducted through the waveguide branches 16. The detectors include photodiodes, phototransistors, photoconductors and charge coupled devices (CCD).

FIGS. 3–6 illustrate techniques for altering various light conduction or transmission through the waveguide branches 16 as a function of key 20 operation. Generally, key operation comprises Boolean data wherein a first or "non-actuated" position is represented by a first characteristic of light, such intensity, density or wavelength, while a second "actuated" position is represented by a second characteristic of light intensity, density or wavelength. With respect to light conducted in the waveguide branches 16 between the key 20 and the light detector 14, key operation can be defined as either interrupting guided modes within the waveguide branch 16 or guided modes can be coupled into the waveguide branches 16 through key operation.

In FIG. 3 the movable member 22 is positioned proximate the waveguide branch 16. In this embodiment, key strokes are detected by attenuation of light received by the light detector 14. In a first, relaxed or non-actuated position, light from light source 12 is conducted through waveguide branch 16 to light detector 14. In a second, actuated position, key displacement causes the movable member 22 to engage the waveguide branch 16 such that a physical deformation of waveguide branch 16 occurs in a manner that attenuates the light transmitted therethrough.

As appreciated by those skilled in the art, engagement of movable member 22 with the waveguide branch 16 can increase the amount of light reached in the light detector 14 in an alternative embodiment. In other words, in the relaxed or non-actuated position, light from light detector 12 is substantially attenuated in waveguide branch 16, while in the actuated position, the waveguide branch 16 is deformed so as to conduct or transmit more light to the light detector 14.

FIG. 4 illustrates a method of keystroke detecting using Frustrated Total Internal Reflection ("FTIR"). In this embodiment, movable member 22 comprises a medium or material of suitable refractive index that is brought into proximity to the waveguide branch 16 with keystroke operation. In the non-actuated position, light is transmitted from the light source 12 to the light detector 14 through the waveguide branch 16. In the second, actuated position, the movable member 22 engages the waveguide branch 16 such that guided modes will be coupled out of the waveguide branch 16, thereby attenuating the light received by the light detector 14. FIG. 5 illustrates an embodiment the non-actuated position attenuates light and the actuated position allows more light to reach the detector 14.

FIG. 6 illustrates a method of keystroke detection using optical tunneling. In this embodiment, movable member 22 is optically coupled to the light detector 14. In the first, non-actuated position, the light detector 14 receives little, if any, light since the light detector 14 is essentially decoupled from the light source 12. In the second, actuated position, movable member 22 is brought into engagement with the waveguide branch 16 that is coupled to the light source 12, such that light is conducted to the light detector 14. As appreciated by those skilled in the art, optical tunneling may be accomplished with very little actual deflection or movement of movable member 22. For instance, movable member 22 can be separated from waveguide branch 16 that is coupled to light source 12 by a suitable cladding layer, which when stressed (e.g., compressed), optical tunneling can then occur. In a manner similar to the embodiment of FIG. 5, the mechanics of the embodiment of FIG. 6 can be changed so that light is attenuated in the actuated position and transmitted to the detector 14 in the non-actuated position, if desired.

Figure 7:
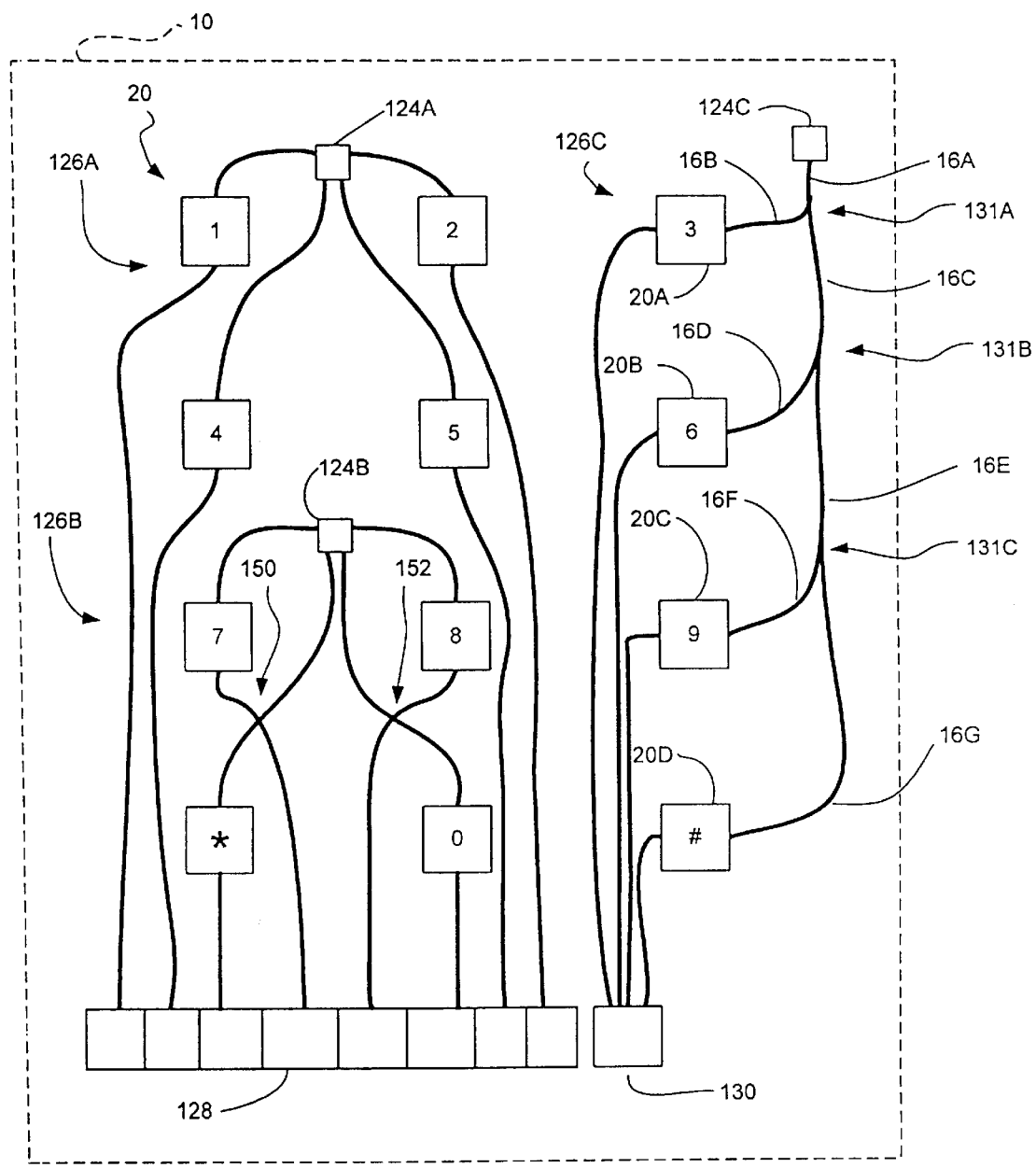
FIG. 7 is a schematic representation of a first embodiment of a waveguide assembly for a keypad having a plurality of keys.

FIG. 7 is a top plan view schematically illustrating the keypad 10 (herein exemplified as a telephone keypad although other keypads or keyboards can be similarly constructed). In this embodiment, a plurality of light sources 124A, 124B and 124C provide light that is transmitted in the waveguide branches 16. Each of the keys 20 is adapted to changes or alter the transmission of light in the waveguide branches 16 in any one or combination of the techniques described above with respect to FIGS. 1, 3–6.

FIG. 7 illustrates a number of features that can be implemented when the keypad 10 is designed and constructed. It should be noted that the keypad 10 is merely an exemplary embodiment illustrating all the features wherein anyone of the features can be used exclusively in the design and construction of the keypad or keyboard, or alternatively, the features can be combined in any combination as desired.

In the exemplary embodiment illustrated, each of the light sources 124A–124C provides light through waveguide branches 16 to a sub-plurality of keys 126A, 126B and 126C, respectively. Although four keys are illustrated in each sub-plurality 124A–124C, sub-pluralities having additional keys or fewer keys can also be constructed.

For the keys of sub-pluralities 124A and 124B, discreet or individual light detectors are provided for each key 20. In the embodiment illustrated, a light detector array 128 is used although discreet light detectors can also be used.

In contrast, a single light detector 130 is provided for the sub-plurality 126C. In this sub-plurality, light from the light source 124C is first conducted along waveguide branch 16A wherein a first portion of light is conducted along waveguide branch 16B and a second portion of light is conducted along waveguide branch 16C. The light conducted along waveguide branch 16B is altered as a function of operation of key 20A and provided to detector 138.

Referring back to waveguide branch 16C the first portion of light conducted therein is conducted along waveguide branch 16D, while a second portion thereof is conducted along waveguide branch 16E. A similar portioning of light from waveguide branch 16E is divided among waveguide branch 16F and waveguide branch 16G. Waveguide branches 16B, 16F and 16G conduct the light from keys 20B, 20C, and 20D, respectively, to detector 138. The light received at detector 138 determines individual key operation. In particular, the splitting or portioning of light at each of the junctures 131A–131C is chosen so as to provide a unique parameter or quantity of light for each of the keys. In this manner, if a measured parameter or quantity of light is received by the detector 130 (or the absence of a certain parameter or quantity of light), an output signal from the detector 130 is indicative of the key that has been operated. Various parameters of light can be used to provide unique characteristics for each key. For instance, a unique density of light conducted through the waveguide branches can be used, or alternatively, a selected bandwidth of light can be associated with each key. Splitters are provided at each of the junctions 131A–131C to perform the portioning or splitting of light.

FIG. 7 further illustrates that waveguide branches can intersect, for example, at 150 and 152 without inhibiting the signals conducted therein. Unlike electrical circuits where isolation must be maintained in order to discriminate which keys have been depressed, light conducted along one waveguide branch can intersect with light conducted along a second waveguide branch without signal interference. The inclination of intersection between the waveguide branches is chosen so as to attenuate any cross-talk in the other waveguide branch before the light is received by the light detector array 128. In one embodiment, the intersecting waveguide branches are substantially transverse to each other at the point of intersection.

Figure 8:
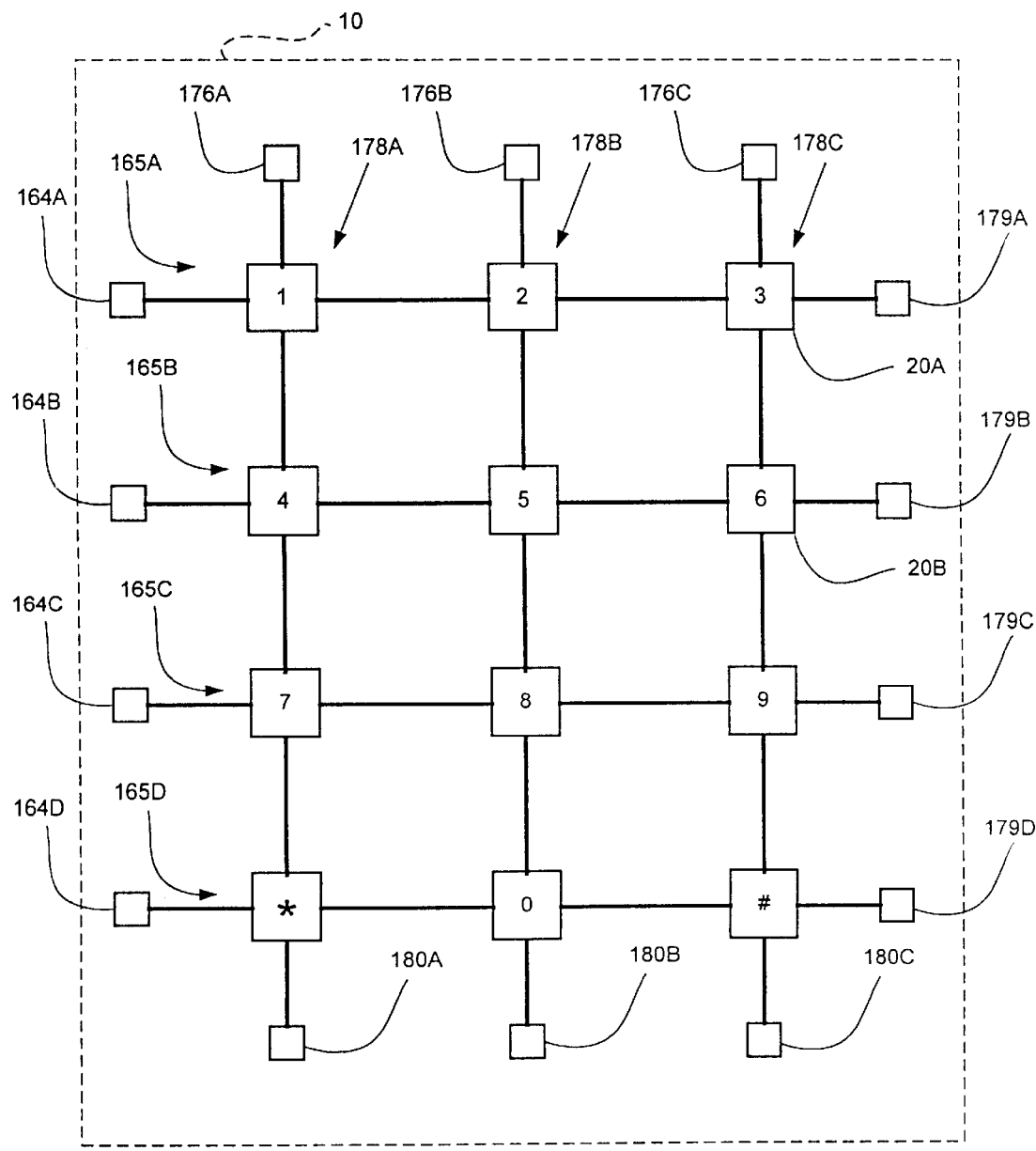
FIG. 8 is a schematic representation of a second embodiment of a waveguide assembly for a keypad having a plurality of keys.

FIG. 8 illustrates another keypad layout. In this embodiment, keypad 10 comprises a plurality of keys wherein each key receives light from two light sources. As illustrated, light sources 164A, 164B, 164C and 164D provide light through waveguide branches or a plurality of keys in rows 165A, 165B, 165C and 165D respectively. Light sources 176A, 176B and 176C likewise provide light through waveguide branches along keys arranged in columns 178A, 178B and 178C respectively. Individual light detectors 179A, 179B, 179C and 179d are provided for each row 164A–164D, respectively, while individual light detectors 180A, 180B and 180C are provided for each of the columns 178A, 178B and 178C, respectively. Output signals from detectors 164A–164D and 180A–180D are decoded in order to determine which key has been operated. For example, light received simultaneously from detectors 179A and 180C can be indicative of actuation of key 20A, while light received simultaneously from detectors 179A, 180C and 179B can be indicative of simultaneous actuation of keys 20A and 20B. The waveguide branches for each of the rows 164A–164D and columns 118A–178C can be isolated from each other (for example in two different planes) or intersect with each other, as discussed above, without signal cross-talk.

In general, a functioning waveguide is formed when the refractive index of the light (conducting medium or composition ("core") is greater than the refractive index of the envelope or "cladding" mediums or compositions. The core medium can be formed from any suitable material, such as polymers or glass, wherein the cladding medium has a refractive index less than the core mediums. In some embodiments, the cladding medium can be simply air.

When used in a keypad, as described herein, waveguide structures need not be highly refined. In other words, losses can be tolerated in the keypad since Boolean data is transmitted over relatively short distances and at a rate considerably less than other common waveguide applications. As long as light received at the detector can be quantified with respect to an actuated and non-actuated position sever losses can be tolerated.

The waveguide structure 15 can be formed using many techniques. In the first technique, photoimaging can be used to alter a polymer sheet to create any desired pattern of waveguide branches. Another technique includes injection molding where the waveguide structure 15 is either formed as a separate part insertable into a keypad housing. Alternatively, "double-shot" loading techniques can be used wherein a light conductive medium is molded into the housing after the housing has been first been molded in a desired shape.

A third method for forming the waveguide structure 15 includes using the stress birefringence characteristics of a light conducting material to form desired waveguide branches therein. In other words, birefringence is induced in a waveguide medium capable of conducting light by physically stressing the medium to define conductive waveguide branches.

Figure 9:
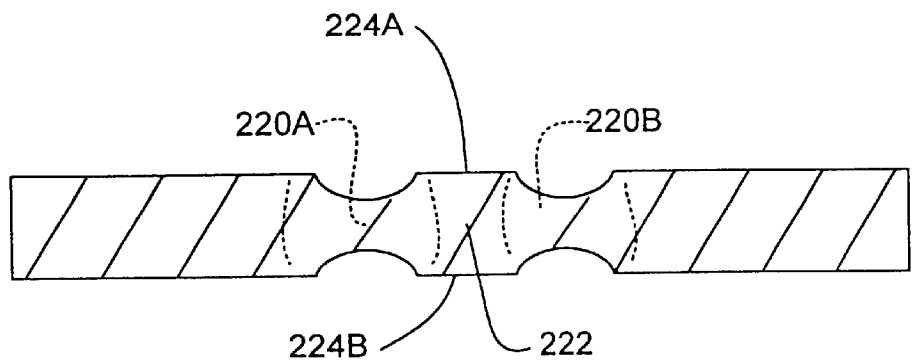
FIG. 9 is a sectional view of a first waveguide assembly having induced stress.
Figure 10:
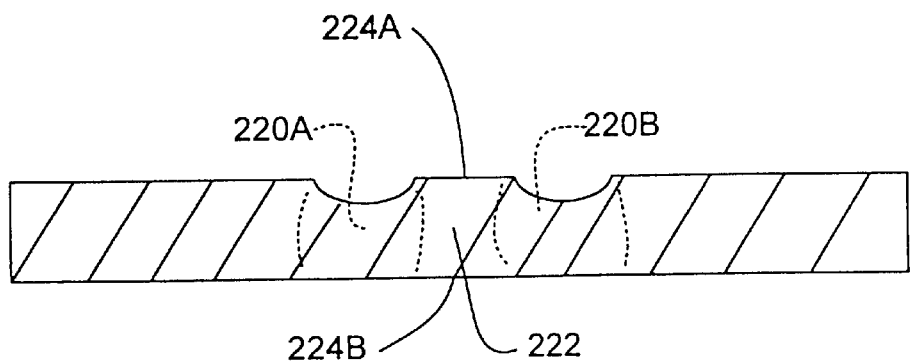
FIG. 10 is a sectional view of a second waveguide assembly having induced stress.
Figure 11:
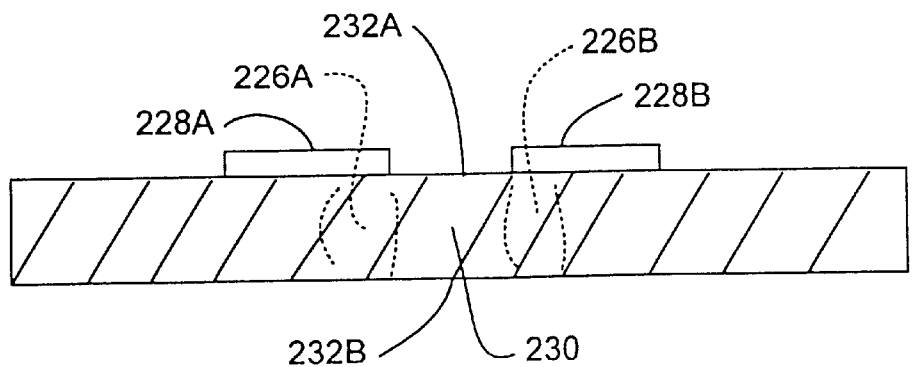
FIG. 11 is a sectional view of a third waveguide assembly having induced stress.

Referring to FIG. 8, stress is induced in the polymer sheet, for example via compression, at selected locations to alter the refracted index of those portions in order to create a waveguide. As illustrated, portions 220A and 220B are plastically deformed, symmetrically, as illustrated in FIG. 9, or asymmetrically as illustrated in FIG. 10. (The dimensions illustrated in FIGS. 9, 10 and 11 are exaggerated for clarity.) Depending on the light conductive medium used, deformation can cause a decrease in refractive index, thereby forming portions functioning as cladding for a core portion 222 or, alternatively, plastic deformation can increase the refractive index to form core portion 222. If desired, the material can be heated during the forming process.

In the embodiments illustrated in FIGS. 9 and 10, the core portion 222 are bounded by air at interfaces 224A and 224B, although a separate cladding material can also be used.

In another forming technique illustrated in FIG. 11, cladding portions 226A and 226B are formed by stress birefringence due to layers 228A and 228B applied to a core medium 230. In this embodiment, the layers of material 228A and 228B are joined to at selected locations to the core medium 230. Due to stress induced by different coefficients of thermal expansion, cladding portions 226A and 226B are formed in the core medium 230 to define the waveguide branches. In one embodiment, the layers 228A and 228B can be joined at an elevated temperature so that upon cooling, stress is induced. As in the previous examples, air at the interfaces 232A and 232B also forms cladding medium.

Figure 12:
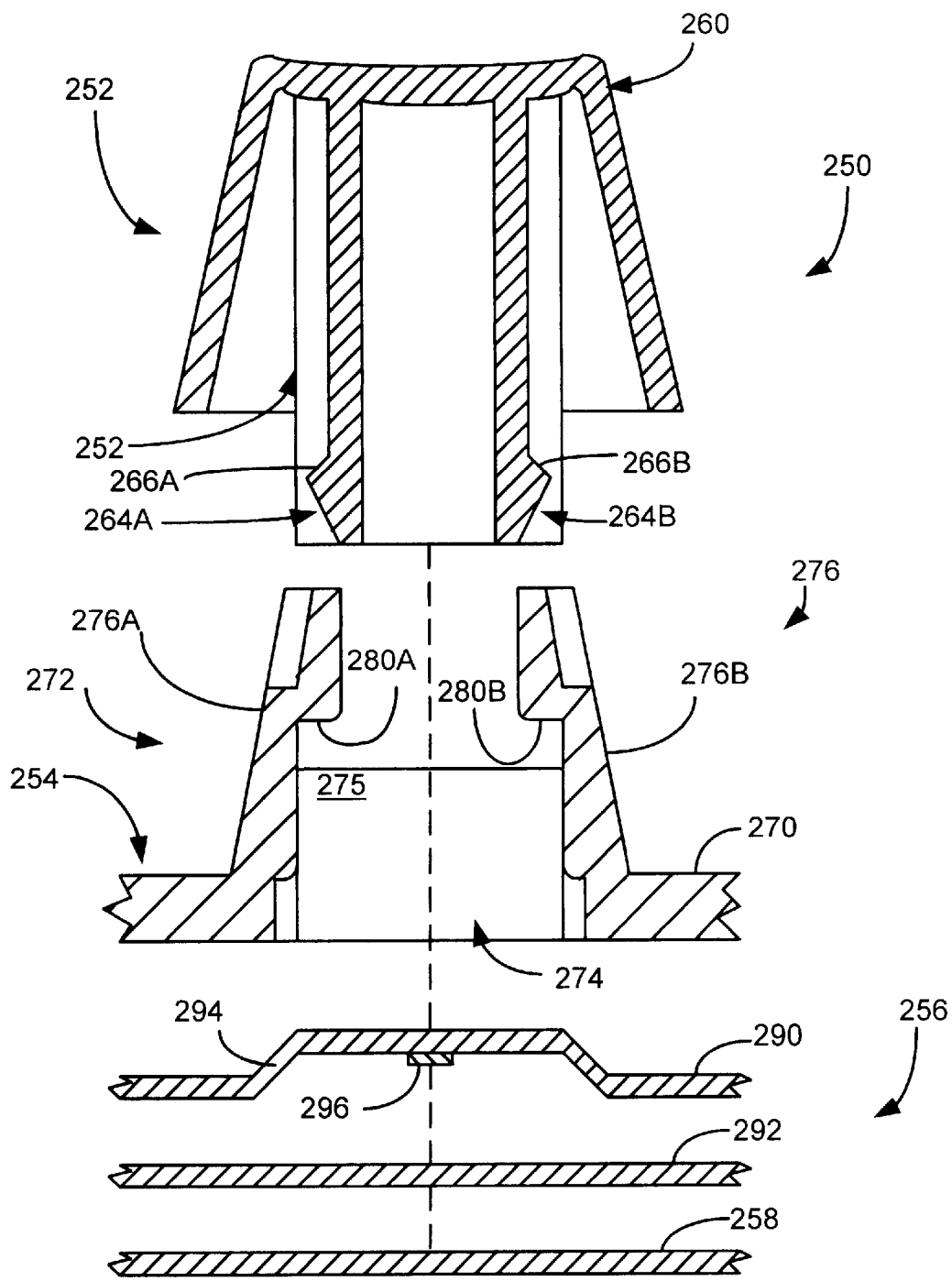
FIG. 12 is an exploded view of an exemplary key plunger and silo design.

FIG. 12 is an exploded view of an exemplary key 250 of a keypad, for example, as used in a keyboard, mouse or gaming device for a computer. Key 250 includes key switch plunger 252, key switch base 254, waveguide assembly 256 and a backing plate 258. Key switch plunger 252 includes key cap 260 and a stem 262, which extends downward from key cap 260 toward key switch base 254. Stem 262 includes a pair of outwardly facing, opposing snaps 264A and 264B. Snaps 264A and 264B have locking surfaces 266A and 266B, respectively, which face upward toward key cap 260.

Key switch base 254 includes a frame 270 and a raised silo 272. Frame 270 has an aperture 274 for each key 250. Silo 272 has a non-closed side wall structure which is formed by blades 276 comprising blades 276A, 276B and a wall portion 275. Blades 276A and 276C are symmetrical with and oppose one another across aperture 274. In one embodiment, aperture 274 is substantially rectangular. However, other aperture shapes can be used, such as circular, oval or irregular shapes.

Silo 272 receives stem 262 through aperture 274. During insulation, stem 262 is inserted into aperture 274 while snaps 264A and 264B are deflected toward each other until locking surfaces 266A and 266B engage corresponding latch receiving surfaces 280A and 280B on the frame 220.

In the embodiment illustrated, waveguide assembly 256 includes a plurality of layers 290 and 292 that are mounted and aligned with backing plate 258. The dimensions of layers 290 and 292 are exaggerated in FIG. 12 for clarity. Layer 290 includes one or more rubber domes 294, which can be formed individually or together in a common sheet. Each dome 294 is aligned with corresponding aperture 274 on frame 270 such that the lower surface of stem 262 contacts the upper surface of the dome 294 when the stem is installed in silo 272. Each dome 294 can be formed of rubber or any other flexible, resilient material. The lower surface of dome 294 includes a movable member 296, which engages a waveguide layer 292 having waveguide branches therein in a manner similar to moveable member 22, as discussed above. Dome 294 is molded in a form that will collapse when key switch plunger 252 is depressed and will provide the user with a tactile snap upon collapse. The movable member 296 can interact with the waveguide layer 298 to change light conduction in the respective branch as described above with respect to FIGS. 3–6. In and alternative embodiment, the movable member 296 can be directly attached to the stem 262 and be compliant to provide a spring force to restore the key 250 when depressed. In this manner, dome 294 is not needed. In yet a further embodiment, the movable member 296 can be both compliant and have a refractive index to operate in the manner described shown with respect to FIG. 5.

The foregoing description provided for key 250 is disclosed in greater detail in co-pending application "INTEGRALLY MOLDED KEYSWITCH BASE", application Ser. No. 09/318,083, filed May 5, 1999, the contents of which are hereby incorporated by reference in its entirety. The details pertaining to key switch plunger 252 and silo 272 are not intended to be limiting in that, as appreciated by those skilled in the art, other key switch plunger/silo designs are well known and can be used with waveguide layer 292.

Although the present invention has been described with reference to preferred embodiments, workers skilled in the art will recognize that changes may be made in form and detail without departing from the spirit and scope of the invention.

What is claimed is:

1. A keypad comprising:
   a light emitting source;
   a light detector;
   a polymer sheet of material having a plurality of waveguide branches adapted to receive light from the light emitting source and conduct the light to the light detector, wherein the waveguide branches are defined by stress induced portions in the material of the polymer sheet, wherein the stress induced portions have a refractive index different than other portions of the material of the polymer sheet, and wherein the stress induced portions of material and the other portions of material are continuous within the polymer sheet; and a plurality of user actuated keys, each key having a movable engaging member proximate a waveguide branch to engage the waveguide branch.

2. The keypad of claim 1 and further comprising a plurality of light detectors, wherein a light detector is provided for each key.

3. The keypad of claim 1 and further comprising a plurality of light detectors wherein each detector is coupled to receive light from one waveguide branch.

4. The keypad of claim 1 and further comprising a plurality of light sources, wherein each light source provides light to a plurality of waveguide branches.

5. The keypad of claim 1 wherein the plurality of waveguide branches include a first set of waveguide branches directly coupled to the light source and a second set of waveguide branches having waveguide branches not directly coupled to the light source but receiving light from waveguide branches of the first set of waveguide branches.

6. The keypad of claim 1 wherein the stress induced portions form cladding portion.

7. The keypad of claim 1 wherein a surface of the polymer sheet is deformed proximate the stress induced portion.

8. The keypad of claim 1 wherein two waveguide branches are provided for each key, and wherein the engaging member is adapted to engage the waveguide branches to inhibit conduction of light through the waveguide branches as a function of corresponding key operation.

9. The keypad of claim 8 and further comprising a second light detector, wherein the first-mentioned light detector is coupled to receive light from a first waveguide branch for each key and the second light detector is coupled to receive light from a second waveguide branch for each key.

10. The keypad of claim 1 wherein at least some of the waveguide branches intersect such that light conduction along one intersecting waveguide branch does not affect light conduction along another intersecting waveguide branch.

11. The keypad of claim 10 wherein the intersecting waveguide branches are oriented substantially transverse to each other.

12. The keypad of claim 1 wherein the stress induced portions form core portions.

13. The keypad of claim 12 wherein some of the core portions are exposed to air.

14. The keypad of claim 1 wherein the waveguide branches are adapted to conduct a unique characteristic of light in each waveguide branch.

15. The keypad of claim 14 wherein the unique characteristic comprises an intensity of light.

16. The keypad of claim 14 wherein the unique characteristic comprises a selected wavelength range.

17. The keypad of claim 1 wherein the engaging member is adapted to engage the waveguide branch to inhibit conduction of light through the waveguide branch as a function of corresponding key operation.

18. The keypad of claim 17 wherein each engaging member includes a light conducting portion engagable with the corresponding waveguide branch, the light conducting portion being adapted to conduct at least a portion of light from the waveguide branch as a function of corresponding key operation.

19. The keypad of claim 17 wherein each engaging member is adapted to deform the corresponding waveguide branch as a function of corresponding key operation.

20. The keypad of claim 19 wherein deformation of each waveguide branch occurs with a force applied to the corresponding key.

21. A computer input device comprising:
a light emitting source;
a light detector;
a polymer sheet of material having a plurality of waveguide branches adapted to receive light from the light emitting source and conduct light to the light detector, wherein the waveguide branches are defined by stress induced portions in the material of the polymer sheet, wherein the stress induced portions have a different refractive index than other portions of the material of the polymer sheet, and wherein the stress induced portions of material and the other portions of material are continuous within the polymer sheet; and
a plurality of user actuated keys, each key having a movable engaging member proximate a waveguide branch to engage the waveguide branch.

22. The computer input device of claim 21 and further comprising a plurality of light detectors, wherein a light detector is provided for each key.

23. The computer input device of claim 21 and further comprising a plurality of light detectors wherein each detector is coupled to receive light from one waveguide branch.

24. The computer input device of claim 21 and further comprising a plurality of light sources, wherein each light source provides light to a plurality of waveguide branches.

25. The computer input device of claim 21 wherein at least some of the waveguide branches intersect such that light conduction along one intersecting waveguide branch does not affect light conduction along another intersecting waveguide branch.

26. The computer input device of claim 21 wherein the plurality of waveguide branches include a first set of waveguide branches directly coupled to the light source and a second set of waveguide branches having waveguide branches not directly coupled to the light source but receiving light from waveguide branches of the first set of waveguide branches.

27. The computer input device of claim 21 wherein the stress induced portion forms a cladding portion.

28. The computer input device of claim 21 wherein a surface of the polymer sheet is deformed proximate the stress induced portion.

29. The computer input device of claim 21 wherein two waveguide branches are provided for each key, and wherein the engaging member is adapted to engage the waveguide branches to inhibit conduction of light through the waveguide branches as a function corresponding key operation.

30. The computer input device of claim 29 and further comprising a second light detector, wherein the first-mentioned light detector is coupled to receive light from a first waveguide branch for each key and the second light detector is coupled to receive light from a second waveguide branch for each key.

31. The computer input device of claim 21 wherein the stress induced portion forms a core portion.

32. The computer input device of claim 31 wherein some of the core portions are exposed to air.

33. The computer input device of claim 21 wherein the engaging member is adapted to engage the waveguide branch to inhibit conduction of light through the waveguide branch as a function of corresponding key operation.

34. The computer input device of claim 33 wherein each engaging member is adapted to deform the corresponding waveguide branch as a function of corresponding key operation.

35. The computer input device of claim 33 wherein each engaging member includes a light conducting portion engagable with the corresponding waveguide branch, the light conducting portion being adapted to conduct at least a portion of light from the waveguide branch as a function of corresponding key operation.

36. The computer input device of claim 21 wherein the waveguide branches are adapted to conduct a unique characteristic of light in each waveguide branch.

37. The computer input device of claim 36 wherein the unique characteristic comprises an intensity of light.

38. The computer input device of claim 37 wherein the unique characteristic comprises a selected wavelength range.

39. The computer input device of claim 21 and further comprising a housing supporting the waveguide branches, the plurality of keys, the light emitting source and the light detector.

40. The computer input device of claim 39 wherein the computer input device comprises an alphanumeric keyboard.

41. The computer input device of claim 40 wherein the computer input device comprises a mouse.

42. The computer input device of claim 40 wherein the computer input device comprises a gaming device.

43. A keypad comprising:

a light emitting source;

a light detector;

a polymer sheet of material having a plurality of waveguide branches adapted to receive light from the light emitting source and conduct the light to the light detector, wherein the waveguide branches are defined by stress induced portions in the material of the polymer sheet, wherein the stress induced portions have a refractive index different than other portions of the material of the polymer sheet, and wherein the stress induced portions of material and the other portions of material are continuous within the polymer sheet;

a plurality of user actuated keys, each key having a movable engaging member proximate a waveguide branch to engage the waveguide branch; and stress inducing layers joined to selected locations on the polymer sheet of material, wherein the stress inducing layers cause the stress induced portions of the material of the polymer sheet.

* * * * *

UNITED STATES PATENT AND TRADEMARK OFFICE
CERTIFICATE OF CORRECTION

PATENT NO. : 6,741,189 B1
DATED : May 25, 2004
INVENTOR(S) : R. Thomas Gibbons

Page 1 of 1

It is certified that error appears in the above-identified patent and that said Letters Patent is hereby corrected as shown below:

Drawings,
Sheet 1 of 7, Fig. 1, insert -- 17 -- between box LIGHT DETECTOR 14 and box CIRCUITRY 19. (pointing to the arrow between the box LIGHT DETECTOR 14 and box CIRCUITRY 19)
Sheet 2 of 7, Fig. 2, delete "MEMORY 22" and insert -- MEMORY 18 --

Column 6,
Line 64, delete "118A" and insert -- 178A --

Signed and Sealed this

Tenth Day of May, 2005

JON W. DUDAS
*Director of the United States Patent and Trademark Office*